(12) United States Patent
Murashige et al.

(10) Patent No.: US 11,260,627 B2
(45) Date of Patent: Mar. 1, 2022

(54) FLEXIBLE SUBSTRATE

(71) Applicant: NITTO DENKO CORPORATION, Ibaraki (JP)

(72) Inventors: Takeshi Murashige, Ibaraki (JP); Takashi Yamaoka, Ibaraki (JP); Daisuke Hattori, Ibaraki (JP); Yoshimasa Sakata, Ibaraki (JP); Tatsuki Nagatsuka, Osaka (JP)

(73) Assignee: NITTO DENKO CORPORATION, Ibaraki (JP)

( * ) Notice: Subject to any disclaimer, the term of this patent is extended or adjusted under 35 U.S.C. 154(b) by 44 days.

(21) Appl. No.: 15/998,859

(22) Filed: Aug. 17, 2018

(65) Prior Publication Data

US 2018/0368256 A1 Dec. 20, 2018

Related U.S. Application Data (62) Division of application No. 14/987,596, filed on Jan. 4, 2016, now abandoned, which is a division of
(Continued)

(30) Foreign Application Priority Data

Apr. 24, 2008 (JP) .................................. 2008-114372

(51) Int. Cl.
*B32B 17/10* (2006.01)
*H01L 51/00* (2006.01)
(Continued)

(52) U.S. Cl.
CPC .......... *B32B 17/10* (2013.01); *H01L 51/0097* (2013.01); *H05K 1/0306* (2013.01);
(Continued)

(58) Field of Classification Search
CPC .... B32B 17/10; B32B 17/064; H05K 1/0306; H05K 1/0353; H05K 1/11; H05K 5/0017;
(Continued)

(56) References Cited

U.S. PATENT DOCUMENTS 6,281,525 B1 8/2001 Krijn et al.
6,287,674 B1 9/2001 Verlinden et al.
(Continued)

FOREIGN PATENT DOCUMENTS

JP 7-157341 A 6/1995
JP 11-329715 A 11/1999
(Continued)

OTHER PUBLICATIONS

International Search Report of PCT/JP2009/057737, dated Jul. 14, 2009.
(Continued)

*Primary Examiner* — John D Freeman
(74) *Attorney, Agent, or Firm* — Westerman, Hattori, Daniels & Adrian, LLP (57) ABSTRACT

There is provided a flexible substrate having excellent flexibility and gas barrier properties. A flexible substrate 100 according to the present invention includes: a base material 20 including an inorganic glass 10 and resin layers 11 and 11' placed on both sides of the inorganic glass 10; and an inorganic thin film 12 placed on a side of one of the resin layers where the inorganic glass is not placed, wherein the inorganic thin film 12 is formed on at least a peripheral edge of one surface of the base material.

13 Claims, 4 Drawing Sheets

Related U.S. Application Data application No. 12/988,764, filed as application No. PCT/JP2009/057737 on Apr. 17, 2009, now abandoned.

(51) Int. Cl.
*H05K 1/03* (2006.01)
*H05K 1/11* (2006.01)
*H05K 5/00* (2006.01)
*H01L 51/52* (2006.01)

(52) U.S. Cl.
CPC ............ *H05K 1/0353* (2013.01); *H05K 1/11* (2013.01); *H05K 5/0017* (2013.01); *H01L 51/5253* (2013.01); *H01L 51/5256* (2013.01); *H01L 2251/5338* (2013.01); *Y02E 10/549* (2013.01); *Y10T 428/266* (2015.01); *Y10T 428/31645* (2015.04)

(58) Field of Classification Search
CPC ............ H01L 51/0097; H01L 51/5253; H01L 51/5256; H01L 2251/5338; H01L 27/1262; H01L 51/5237; Y10T 428/31645; Y10T 428/266; Y02E 10/549
See application file for complete search history.

(56) References Cited

U.S. PATENT DOCUMENTS

| | | | |
|---|---|---|---|
| 6,592,969 B1 | 7/2003 | Burroughes et al. | |
| 6,689,626 B2 | 2/2004 | Krijn et al. | |
| 6,815,070 B1 | 11/2004 | Burkle et al. | |
| 6,853,123 B1 | 2/2005 | Nattermann et al. | |
| 6,994,906 B2 | 2/2006 | Burroughes et al. | |
| 7,514,866 B2 | 4/2009 | Burroughes et al. | |
| 2001/0041268 A1* | 11/2001 | Arai ..................... | H01L 51/525 428/690 |
| 2001/0050372 A1 | 12/2001 | Krijn et al. | |
| 2003/0124341 A1 | 7/2003 | Burroughes et al. | |
| 2005/0029513 A1 | 2/2005 | Kawashima et al. | |
| 2005/0133781 A1* | 6/2005 | Yan ..................... | H01L 51/5253 257/40 |
| 2005/0269943 A1 | 12/2005 | Hack et al. | |
| 2006/0134394 A1 | 6/2006 | Burroughes et al. | |
| 2007/0012955 A1 | 1/2007 | Ihama | |
| 2007/0020451 A1* | 1/2007 | Padiyath ................. | B05D 7/58 428/336 |
| 2009/0239000 A1* | 9/2009 | Sugita ..................... | H01L 51/56 428/1.1 |
| 2009/0267502 A1* | 10/2009 | Diekmann .......... | H01L 51/5262 313/504 |
| 2010/0062234 A1 | 3/2010 | Murashige et al. | |

FOREIGN PATENT DOCUMENTS

| | | | |
|---|---|---|---|
| JP | 2002-521234 A | 7/2002 | |
| JP | 2002-297054 A | 10/2002 | |
| JP | 2002-299041 A | 10/2002 | |
| JP | 2002-534305 A | 10/2002 | |
| JP | 2002-542971 A | 12/2002 | |
| JP | 2004-79432 A | 3/2004 | |
| JP | 2004-082598 A | 3/2004 | |
| JP | 2005-103949 A | 4/2005 | |
| JP | 2005-342898 A | 12/2005 | |
| JP | 2007-10834 A | 1/2007 | |
| JP | 2007-056180 A | 3/2007 | |
| JP | 2007-203474 A | 8/2007 | |
| JP | 2007-299770 A | 11/2007 | |
| TW | 200711195 A | 3/2007 | |
| WO | 00/66507 A1 | 11/2000 | |
| WO | WO-2008040275 A1 * | 4/2008 | ......... H01L 51/5262 |

OTHER PUBLICATIONS

Japanese Office Action dated Jun. 26, 2013, issued in corresponding Japanese Patent Application No. 2009-099561, w/ English translation.
Taiwanese Office Action dated Jun. 10, 2014, issued in corresponding Taiwanese Patent Application No. 098113522 with English translation (7 pages).
Japanese Office Action dated Aug. 20, 2014, issued in corresponding Japanese Applcation No. 2013-171634; w/ English Translation. (9 pages).
Japanese Office Action dated Oct. 31, 2012, issued in counterpart Japanese Patent Application No. 2009-099561, (9 pages). With English Translation.
Machine translation of JP 2002-297054 (2011).
Machine translation of JP 2004-082598 (2011).
Machine translation of JP 2005-342898 (2011).

* cited by examiner

FLEXIBLE SUBSTRATE

CROSS REFERENCE TO RELATED APPLICATIONS

This application is a divisional application of U.S. patent application Ser. No. 14/987,596, filed Jan. 4, 2016, which is a divisional application of U.S. patent application Ser. No. 12/988,764, filed Nov. 3, 2010, now abandoned, which is a National Stage Entry of PCT/JP2009/057737, filed Apr. 17, 2009; claiming priority to Japanese Patent Application No. 2008-114372, filed Apr. 24, 2008, the entire contents is herein incorporated by reference.

TECHNICAL FIELD

The present invention relates to a flexible substrate, and more specifically, to a flexible substrate having excellent gas barrier properties.

BACKGROUND ART

In association with the development of an image communication technology, the thinning of flat panel displays (FPDs) has been advanced in recent years. A substrate that brings together flexibility and impact resistance will be indispensable for the realization of a curved surface display of a large panel seeking for a high realistic sensation and an improvement in flexibility of a take-up type portable terminal or the like pursuing portability and convenience.

Glass substrates have been widely used as substrates for the FPDs. However, when one attempts to perform the thinning of any such glass substrate for imparting flexibility to the glass substrate, impact resistance becomes insufficient, and hence, for example, the following problem arises. That is, the glass substrate is apt to crack in a production process for an FPD.

In view of the foregoing, investigations have been conducted on the use of resin films each of which has excellent impact resistance and has a light weight and excellent flexibility as substrates for the FPDs instead of the glass substrates. However, none of the resin films can provide sufficient gas barrier properties (such as oxygen-blocking property and water vapor-blocking property) requested of a substrate for an FPD alone.

A gas barrier laminate material obtained by laminating a metal oxide film or the like and an organic layer on a base material has been proposed for improving the gas barrier properties (see Patent Document 1). However, the gas barrier properties of the laminate material of Patent Document 1 are still not enough for the laminate material to be used in an organic electroluminescence display apparatus of which high gas barrier properties are requested out of the FPDs.

PRIOR ART DOCUMENT

Patent Document

[Patent Document 1] JP 2004-82598 A

SUMMARY OF THE INVENTION

Problems to be Solved by the Invention

The present invention has been made to solve the above-mentioned conventional problems, and an object of the present invention is to provide a flexible substrate having excellent flexibility and gas barrier properties.

Means for Solving the Problems

A flexible substrate according to an embodiment of the present invention includes: a base material including an inorganic glass and resin layers placed on both sides of the inorganic glass; and an inorganic thin film placed on a side of one of the resin layers where the inorganic glass is not placed, wherein the inorganic thin film is formed on at least a peripheral edge of one surface of the base material.

In a preferred embodiment of the invention, the inorganic thin film is formed on an entire surface of the one surface of the base material.

In a preferred embodiment of the invention, the flexible substrate further includes a smoothing layer, the smoothing layer being placed on a side of the inorganic thin film where the resin layers are not placed.

In a preferred embodiment of the invention, the flexible substrate further includes another inorganic thin film, wherein the another inorganic thin film is placed on a side of the smoothing layer where the resin layers are not placed.

In a preferred embodiment of the invention, the flexible substrate has a thickness (total thickness) of 600 μm or less.

In a preferred embodiment of the invention, the resin layers are each formed of a resin composition containing an epoxy-based resin and/or an oxetane-based resin as a main component.

In a preferred embodiment of the invention, the resin layers each contain a thermoplastic resin having repeating units represented by a general formula (X) and/or a general formula (Y):

[Chem 1]

where:
$R_1$ represents a substituted or unsubstituted aryl group having 6 to 24 carbon atoms, a cycloalkylene group having 4 to 14 carbon atoms, or a linear or branched alkylene group having 1 to 8 carbon atoms; $R_2$ represents a substituted or unsubstituted aryl group having 6 to 24 carbon atoms, a linear or branched alkyl group having 1 to 8 carbon atoms, a linear or branched alkylene group having 1 to 8 carbon atoms, a cycloalkyl group having 5 to 12 carbon atoms, a cycloalkylene group having 5 to 12 carbon atoms, or a hydrogen atom; $R_3$ and $R_4$ each independently represent a linear or branched alkyl group having 1 to 8 carbon atoms, a hydrogen atom, a linear or branched alkylene group having 1 to 8 carbon atoms, a cycloalkyl group having 5 to 12 carbon atoms, or a cycloalkylene group having 5 to 12 carbon atoms; A represents a carbonyl group, or a linear or branched alkylene group having 1 to 8 carbon atoms; m represents an integer of 0 to 8; and n represents an integer of 0 to 4.

In a preferred embodiment of the invention, the resin layers each contain a thermoplastic resin having one or more repeating units represented by a general formula (Z):

[Chem 2]

(Z)

where:
R$^1$ represents a substituted or unsubstituted aryl group having 6 to 24 carbon atoms, a linear or branched alkylene group having 1 to 8 carbon atoms, or a cycloalkylene group having 4 to 14 carbon atoms, or an oxygen atom; and R$^2$ represents a substituted or unsubstituted aryl group having 6 to 24 carbon atoms, a linear or branched alkyl group having 1 to 8 carbon atoms, a linear or branched alkylene group having 1 to 8 carbon atoms, a cycloalkyl group having 5 to 12 carbon atoms, a cycloalkylene group having 5 to 12 carbon atoms, or a hydrogen atom.

In a preferred embodiment of the invention, the resin layers each contain a polyether sulfone-based resin.

In a preferred embodiment of the invention, the inorganic thin film contains at least one kind of an inorganic compound selected from the group consisting of oxides, nitrides, hydrides, and composite compounds of them. In a preferred embodiment of the invention, the inorganic compound has an amorphous structure.

In a preferred embodiment of the invention, the inorganic thin film is of a three-layer configuration having an inorganic oxide layer, an inorganic nitride layer, and an inorganic oxide layer.

In a preferred embodiment of the invention, the flexible substrate further includes a transparent electrode placed on a side of the inorganic thin film where the resin layers are not placed.

According to another aspect of the present invention, an organic electroluminescence display apparatus is provided. The organic electroluminescence display apparatus includes the flexible substrate as described above.

Effects of the Invention

According to the present invention, there can be provided a flexible substrate having excellent flexibility and gas barrier properties as a result of the possession of an inorganic glass, resin layers, and an inorganic thin film. To be specific, the inorganic glass placed at the center can function as a gas barrier layer. In addition, a gas or moisture which penetrates from an end of each resin layer can be blocked by the inorganic thin film. As a result, the flexible substrate can be excellent in gas barrier properties. The use of such flexible substrate can realize an organic electroluminescence (EL) display apparatus capable of continuing a good emission state for a long time period (that is, having excellent storage stability). Meanwhile, the inorganic glass can suppress the thermal expansion of each resin layer having a high coefficient of linear expansion, and can provide a substrate having a small coefficient of linear expansion. The rupture of the inorganic glass is generally considered to be caused by the concentration of a stress on minute defects on its surface, and the thinning of the inorganic glass is difficult because the smaller the thickness of the inorganic glass, the higher the possibility that the rupture occurs. In the flexible substrate of the present invention, the resin layers placed on both sides of the inorganic glass alleviate a stress in the direction in which the inorganic glass is torn toward the defects at the time of its deformation. Accordingly, the thinning and weight reduction of the inorganic glass can be achieved. As a result, the flexible substrate can be excellent in flexibility, secondary processability, and operability.

DESCRIPTION OF EMBODIMENTS

A. Entire Configuration of Flexible Substrate

Figure 1:
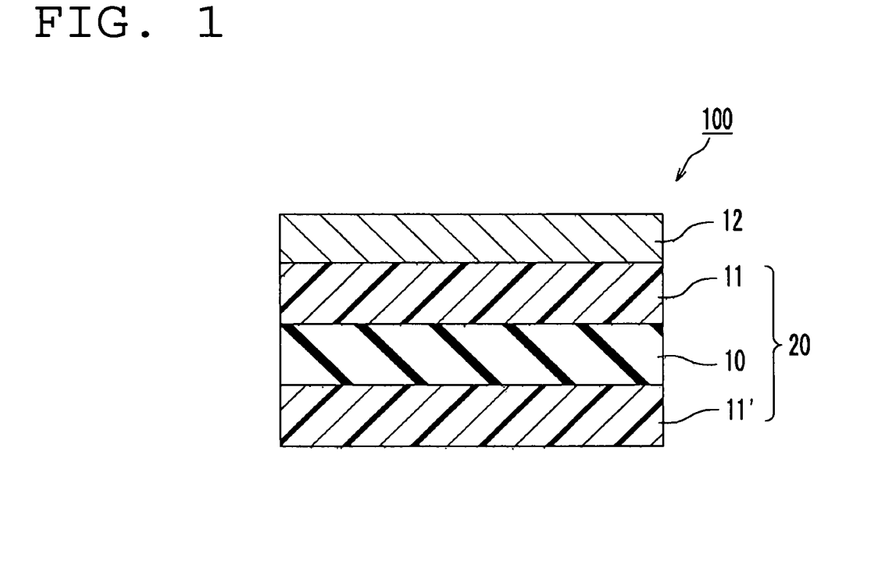
FIG. 1 is a schematic sectional view of a flexible substrate according to one embodiment of the present invention.
Figure 2:
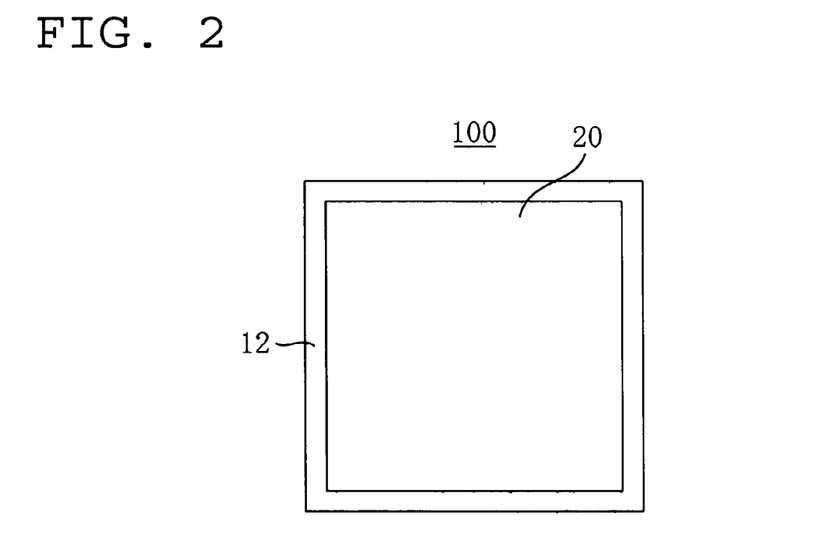
FIG. 2 is a schematic plan view of a flexible substrate according to another embodiment of the present invention.

FIG. 1 is a schematic sectional view of a flexible substrate according to a preferred embodiment of the present invention. The flexible substrate 100 includes a base material 20 and an inorganic thin film 12 formed on at least one surface of the base material 20. The base material 20 includes an inorganic glass 10, and resin layers 11 and 11' placed on both sides of the inorganic glass 10. The inorganic thin film 12 is placed on the side of the resin layer 11 where the inorganic glass 10 is not placed. FIG. 2 is a plan view of the flexible substrate according to another preferred embodiment of the present invention. In the flexible substrate 100, the inorganic thin film 12 is placed on the peripheral edge of one surface of the base material 20. The inorganic thin film may be formed only on the peripheral edge of one surface of the base material as illustrated in FIG. 2, or may be formed on the entire surface of the one surface of the base material as illustrated in FIG. 1. Such configuration provides a flexible substrate having excellent flexibility and gas barrier properties. When the resin layer on the side of the flexible substrate where an organic EL device is formed contains a component responsible for outgassing such as a monomer of the resin, a solvent, moisture, or an additive, the inorganic thin film is preferably formed so as to cover not only the entire surface of the one surface of the base material (substantially the surface of the resin layer) but also the entirety of the base material.

Figure 3:
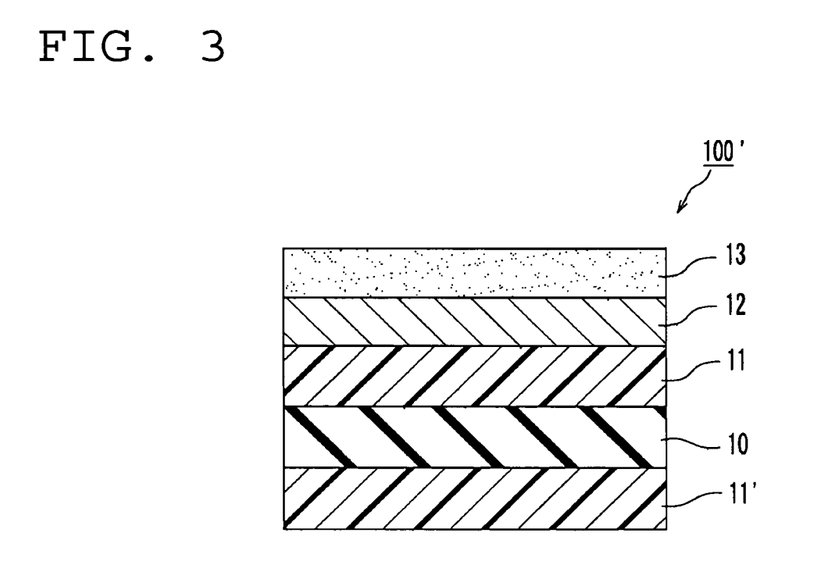
FIG. 3 is a schematic sectional view of a flexible substrate according to still another embodiment of the present invention.
Figure 4:
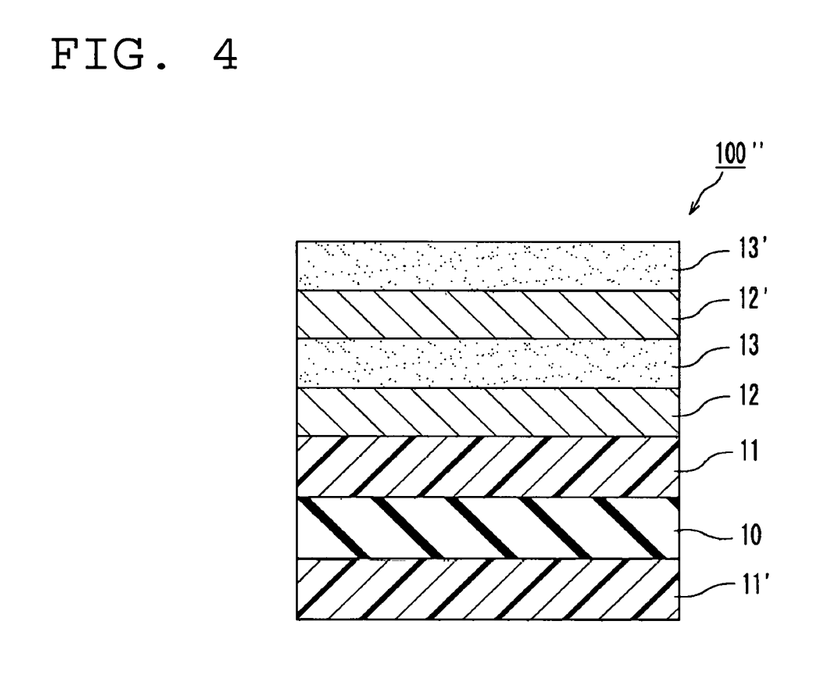
FIG. 4 is a schematic sectional view of a flexible substrate according to still another embodiment of the present invention.

FIG. 3 is a schematic sectional view of a flexible substrate according to still another preferred embodiment of the present invention. The flexible substrate 100' further includes a smoothing layer 13 in addition to the inorganic glass 10, the resin layers 11 and 11', and the inorganic thin film 12. The smoothing layer 13 is placed on the side of the inorganic thin film 12 where the resin layer 11 is not placed. Providing the smoothing layer smoothes unevenness on the surface of the inorganic thin film, and hence a flexible substrate having excellent surface smoothness can be obtained. FIG. 4 is a schematic sectional view of a flexible substrate according to still another preferred embodiment of the present invention. The flexible substrate 100" further includes another inorganic thin film 12' and another smoothing layer 13' on the surface of the smoothing layer 13. In this embodiment, the other inorganic thin film 12' is placed on the side of the smoothing layer 13 where the resin layer 11 is not placed. As described above, the flexible substrate of the present invention can include a plurality of inorganic thin films. Providing the plurality of inorganic thin films can provide additionally excellent gas barrier properties. In addition, the flexible substrate of the present invention can include a plurality of smoothing layers. A smoothing layer is preferably placed on the side of the adjacent inorganic thin film where no resin layer is placed like the illustrated example.

The resin layers 11 and 11' placed on both sides of the inorganic glass 10 may be formed of the same material, or may be formed of different materials. The resin layers are preferably formed of the same material. The thickness of each of the resin layers 11 and 11' can be set to any appropriate thickness. To be specific, the resin layers may be substantially identical to each other in thickness, or may be different from each other in thickness in consideration of, for example, a stress applied to the base material at the time of the step of forming the inorganic thin film. The thickness of the resin layer on the side where the inorganic thin film is formed is preferably made large because of, for example, the following reason. That is, the resin layer can be prevented from being convexed toward the inorganic thin film in the step of forming the inorganic thin film. Such configuration can provide a flexible substrate having a small coefficient of linear expansion, and having extremely excellent operability and secondary processability.

It is preferred that the resin layers 11 and 11' be directly formed on the inorganic glass 10. To be specific, the resin layers 11 and 11' are each formed on the inorganic glass without through any adhesion layer. Such configuration can provide an additionally thin flexible substrate. It should be noted that the resin layers 11 and 11' may each be fixed to the inorganic glass through an adhesion layer. The adhesion layer is formed of any appropriate adhesive or pressure-sensitive adhesive.

The inorganic glass has a thickness $d_g$ of preferably 1 to 400 µm, more preferably 10 to 200 µm, and particularly preferably 30 to 100 µm. The thickness of the inorganic glass can be reduced by placing the resin layers on both sides of the inorganic glass.

The resin layers each have a thickness $d_r$ of preferably 1 to 250 µm, and more preferably 10 to 125 µm. As described above, the resin layers 11 and 11' may be identical to or different from each other in thickness. The resin layers have a total thickness $d_{rsum}$ of preferably 2 to 250 µm, and more preferably 20 to 250 µm.

A ratio $d_{rsum}/d_g$ of the total thickness $d_{rsum}$ of the resin layers to the thickness $d_g$ of the inorganic glass is preferably 0.01 to 10, more preferably 0.1 to 5, and particularly preferably 0.8 to 2.5. When the total thickness of the resin layers and the thickness of the inorganic glass have such relationship, the thermal expansion of each resin layer can be suppressed by the inorganic glass, and at the same time, the inorganic glass can be reinforced. As a result, coexistence of low linear expansion and a mechanical strength can be achieved. A ratio $\{(d_r-d_g)/d_g\}$ of a difference $(d_r-d_g)$ between the thickness $d_r$ of each resin layer and the thickness $d_g$ of the inorganic glass to the thickness $d_g$ of the inorganic glass is preferably −0.95 to 1.5, and more preferably −0.6 to 0.3. When the thicknesses have such relationship, the warping or wave of the resultant flexible substrate can be extremely suppressed because thermal stresses are uniformly applied to both surfaces of the inorganic glass even at the time of a heat treatment.

The inorganic thin film has a thickness of preferably 1 nm to 20 µm, more preferably 5 nm to 15 µm, and particularly preferably 10 nm to 10 µm. When the inorganic thin film has such thickness, additionally excellent gas barrier properties can be obtained.

The smoothing layer has a thickness of preferably 1 nm to 20 µm, more preferably 5 nm to 10 µm, and particularly preferably 10 nm to 5 µm. Providing a smoothing layer having such thickness smoothes the unevenness on the surface of the inorganic thin film, and hence a flexible substrate additionally having excellent surface smoothness can be obtained.

The thickness (total thickness) of the above-mentioned flexible substrate can be set to any appropriate value depending on the configuration of the flexible substrate. The thickness is preferably 600 µm or less, more preferably 1 to 400 µm, and particularly preferably 20 to 200 µm.

The average coefficient of linear expansion at 170° C. of the flexible substrate is preferably 20 ppm° C.$^{-1}$ or less, and more preferably 10 ppm° C.$^{-1}$ or less. When the average coefficient of linear expansion falls within the above-mentioned range, for example, even if the substrate is subjected to a plurality of heat treatment steps, the displacement of pixels, and the rupture and cracks of wiring are unlikely to occur.

The rupture diameter of the flexible substrate when curved is preferably 30 mm or less, and more preferably 10 mm or less.

The transmittance of the flexible substrate at a wavelength of 550 nm is preferably 85% or more, and more preferably 90% or more. The reduction ratio of light transmittance of the flexible substrate after the heat treatment at 180° C. for 2 hours is preferably within 5%. This is because, with such reduction ratio, the practically acceptable light transmittance can be kept, for example, even if a heat treatment required in a FPD production process is conducted. One of the effects of the present invention is that such characteristics are realized while adopting a resin layer.

A surface roughness Ra of the flexible substrate (substantially, a surface roughness Ra of each of a resin layer, an inorganic thin film, or a smoothing layer) is preferably 5 nm or less, and more preferably 2 run or less. The wave of the flexible substrate is preferably 0.5 µm or less, and more preferably 0.1 µm or less. The flexible substrate with such characteristics has excellent quality.

B. Inorganic Glass

A shape of the inorganic glass used in the flexible substrate of the present invention is typically a plate shape. Examples of the inorganic glass include soda-lime glass, borate glass, aluminosilicate glass, and quartz glass according to the classification based on a composition. Further, according to the classification based on an alkali component, examples of the inorganic glass include no-alkali glass and low alkali glass. The content of an alkali metal component (e.g., $Na_2O$, $K_2O$, $Li_2O$) of the inorganic glass is preferably 15 wt % or less, and more preferably 10 wt % or less.

The transmittance of the inorganic glass at a wavelength of 550 nm is preferably 90% or more. A refractive index $n_g$ of the inorganic glass at a wavelength of 550 nm is preferably 1.4 to 1.6.

An average coefficient of thermal expansion of the inorganic glass is preferably 10 ppm° C.$^{-1}$ to 0.5 ppm° C.$^{-1}$, and more preferably 5 ppm° C.$^{-1}$ to 0.5 ppm° C.$^{-1}$. The inorganic glass in the above-mentioned range can effectively suppress a change in dimension of a resin layer in a high-temperature or low-temperature environment.

The density of the inorganic glass is preferably 2.3 g/cm$^3$ to 3.0 g/cm$^3$, and more preferably 2.3 g/cm$^3$ to 2.7 g/cm$^3$. With the inorganic glass in the above-mentioned range, a light-weight flexible substrate is obtained.

As a method of forming the inorganic glass, any appropriate method can be adopted. The inorganic glass is typically produced by melting a mixture containing a main material such as silica and alumina, an antifoaming agent such as salt cake and antimony oxide, and a reducing agent such as carbon at a temperature of 1400° C. to 1600° C. to form a thin plate, followed by cooling. Examples of the method of forming a thin plate of the inorganic glass include a slot down draw method, a fusion method, and a float method. The inorganic glass formed into a plate shape by any one of those methods may be chemically polished with a solvent such as hydrofluoric acid, if required, in order to reduce the thickness and enhance smoothness.

As the inorganic glass, commercially available glass may be used as it is, or commercially available inorganic glass may be polished so as to have a desired thickness and used. Examples of the commercially available inorganic glass include "7059," "1737," and "EAGLE 2000" each manufactured by Corning Incorporated, "AN100" manufactured by Asahi Glass Co., Ltd., "NA-35" manufactured by NH Technoglass Corporation, "OA-10" manufactured by Nippon Electric Glass Co., Ltd., and "D263" and "AF45" each manufactured by SCHOTT AG.

C. Resin Layer

A transmittance of each of the resin layers at a wavelength of 550 nm is preferably 85% or more. A refractive index ($n_r$) of each of the resin layers at a wavelength of 550 run is preferably 1.3 to 1.7. The difference between the refractive index ($n_r$) of each of the resin layers and a refractive index ($n_g$) of the inorganic glass is preferably 0.2 or less, and more preferably 0.1 or less. When the difference in refractive index falls within such range, the adverse effect on the display characteristics caused by the difference in refractive index between the inorganic glass and the resin layers can be prevented.

The elastic moduli (Young's moduli) of the resin layers are each preferably 1 GPa or more, and more preferably 1.5 GPa or more. When the elastic moduli each fall within the above-mentioned range, even if the inorganic glass is made thin, a stress in the direction in which the inorganic glass is torn toward the defects at the time of its deformation is alleviated by the resin layers, so cracks and rupture of the inorganic glass are unlikely to occur.

As a resin composition for forming each of the resin layers, any appropriate resin composition can be adopted. The resin composition preferably includes a resin having excellent heat resistance. The resin may be a thermosetting or UV-curable resin, or may be a thermoplastic resin. Examples of the thermosetting or UV-curable resin include a polyarylate-based resin, a polyimide-based resin, a polyethylene naphthalate-based resin, a polyether sulfone-based resin, a polycarbonate-based resin, an epoxy-based resin, an oxetane-based resin, an acrylic resin, and a polyolefin-based resin. Any appropriate site (such as a terminal of the main chain) of each of those resins may be subjected to modification according to any appropriate mode (such as modification with a hydroxyl group). In addition, those resins may be used alone or in combination. When a thermosetting or UV-curable resin is used, the resin layers are each particularly preferably formed of a resin composition containing an epoxy-based resin and/or an oxetane-based resin as a main component. This is because resin layers each of which has excellent surface smoothness and has a good hue are obtained. In addition, the resin layers are each preferably formed of a resin composition containing a polyether sulfone-based resin a terminal of which is modified with a hydroxyl group and/or an oxetane-based resin as a main component.

As the epoxy-based resin, any appropriate resin can be used as long as the resin has an epoxy group in its molecule. Examples of the epoxy-based resin include bisphenol types such as a bisphenol A type, a bisphenol F type, a bisphenol S type, and a hydrogenated substance thereof; novolac types such as a phenol novolac type and a cresol novolac type; nitrogen-containing cyclic types such as a triglycidylisocyanurate type and a hydantoin type; alicyclic types; aliphatic types; aromatic types such as a naphthalene type and a biphenyl type; glycidyl types such as a glycidyl ether type, a glycidyl amine type, and a glycidyl ester type; dicyclo types such as a dicyclopentadiene type; ester types; ether ester types; and modified types thereof. These epoxy-based resins may be used alone or in combination.

The epoxy-based resin is preferably a bisphenol A-type epoxy-based resin, an alicyclic-type epoxy-based resin, a nitrogen-containing cyclic-type epoxy-based resin, or a glycidyl-type epoxy-based resin. When the above-mentioned epoxy-based resin is of a nitrogen-containing cyclic type, the epoxy-based resin is preferably any one of the triglycidylisocyanurate-type epoxy-based resins. Those epoxy-based resins each have excellent discoloration-preventing property.

Each of the resin layers is preferably a cured layer of at least one kind of an epoxy-based prepolymer selected from the group consisting of the following general formulae (I), (II), (III), and (IV).

[Chem 3]

(I)

In the above formula (I): $X_1$ and $X_2$ each independently represent a covalent bond, a $CH_2$ group, a $C(CH_3)_2$ group, a $C(CF_3)_2$ group, a CO group, an oxygen atom, a nitrogen atom, a $SO_2$ group, a $Si(CH_2CH_3)_2$ group, or a $N(CH_3)$ group; $Y_1$ to $Y_4$ each represent substituents, and a to d each represent a substitution number; $Y_1$ to $Y_4$ each independently represent a hydrogen atom, a halogen atom, an alkyl group having 1 to 4 carbon atoms, a substituted alkyl group having 1 to 4 carbon atoms, a nitro group, a cyano group, a thioalkyl group, an alkoxy group, an aryl group, a substituted aryl group, an alkyl ester group, or a substituted alkyl ester group; a to d each represent an integer of 0 to 4; and l represents an integer of 2 or more.

[Chem 4]

(II)

In the above formula (II): $X_3$ and $X_4$ each independently represent a $CH_2$ group, a $C(CH_3)_2$ group, a $C(CF_3)_2$ group, a CO group, an oxygen atom, a nitrogen atom, a $SO_2$ group, a $Si(CH_2CH_3)_2$ group, or a $N(CH_3)$ group; $Y_5$ to $Y_7$ each represent substituents; e to g represent a substitution number; $Y_5$ to $Y_7$ each independently represent a hydrogen atom, a halogen atom, an alkyl group having 1 to 4 carbon atoms, a substituted alkyl group having 1 to 4 carbon atoms, a nitro group, a cyano group, a thioalkyl group, an alkoxy group, an aryl group, a substituted aryl group, an alkyl ester group, or a substituted alkyl ester group; e and g each represent an integer of 0 to 4; f represents an integer of 0 to 3; and m represents an integer of 2 or more

[Chem 5]

(III)

In the above formula (III): $X_5$ and $X_7$ each independently represent a covalent bond, a $CH_2$ group, a $C(CH_3)_2$ group, a $C(CF_3)_2$ group, a CO group, an oxygen atom, a nitrogen atom, a $SO_2$ group, a $Si(CH_2CH_3)_2$ group, or a $N(CH_3)$ group; and $Y_8$ represents any one of the above formulas (a) to (d).

[Chem 6]

(IV)

In the above formula (IV): n and m each represent an integer of 1 to 6; and $Y_9$ is a portion represented by the above formula (a) or (b).

An epoxy resin represented by the following general formula (V) is preferably used as the epoxy-based resin.

[Chem 7]

(V)

In the above formula (V): R represents a residue of an organic compound having z active hydrogens, and the organic compound is at least one selected from compounds each containing at least one hydroxyl group alone as an active hydrogen group, and unsaturated alcohols each containing at least one hydroxyl group alone as an active hydrogen group and each simultaneously containing an unsaturated double bond-containing group; $n_1$, $n_2$, . . . $n_z$ each represent an integer of 0 or 1 to 30, and their sum equals 1 to 100; z represents an integer of 1 to 10 representing the number of active hydrogen groups of R; and A represents an oxycyclohexane skeleton having a substituent X, the skeleton being a group represented by the following formula (VI) (in the formula (VI), X represents an epoxy group).

[Chem 8]

(VI)

Specific examples of R in the above formula (V) include the respective residues of ethylene glycol, diethylene glycol, triethylene glycol, trimethylolpropane, trimethylol melamine, and isocyanuric acid. Of those, the trimethylolpropane residue is preferably used in terms of the ease of availability and the ease of handling of the resin. The maximum z out of the subscripts of $n_1, n_2, \ldots n_z$ represents the number of active hydrogen groups of R, and for example, the value for z is 2 in the case of ethylene glycol or 3 in the case of trimethylolpropane. In the case where z equals 0, no epoxy group can be incorporated, and hence an improving effect on a viscosity is hardly obtained. On the other hand, the case where z is equal to or larger than 11 is not economical because a compound to serve as the skeleton is hardly available and has a high price.

The numbers $n_1, n_2, \ldots n_z$ of bonded epoxy group-containing cyclohexyl ether groups each represented by A (chain lengths) each represent an integer of 0 or 1 to 30, and their sum equals 1 to 100. When any one of $n_1, n_2, \ldots n_z$ exceeds 30, the viscosity of the epoxy resin increases, and hence the handleability may deteriorate. In addition, when the sum of $n_1, n_2, \ldots n_z$ equals 0, no reactivity is obtained. When the sum exceeds 100, the extent to which the viscosity increases at the time of melting and kneading is difficult to control. When R represents the trimethylolpropane residue, it is preferred that $n_1$, $n_2$, and $n_3$ each represent an integer of 5 to 30 and their sum equal 15 to 90.

The epoxy equivalence (mass per epoxy group) of the epoxy-based resin is preferably 100 g/eqiv. to 1000 g/eqiv. When the epoxy equivalence falls within the above-mentioned range, the flexibility and strength of a resin layer to be obtained can be enhanced.

The softening point of the epoxy-based resin is preferably 120° C. or less. Further, the epoxy-based resin is preferably a liquid at room temperature (e.g., 5 to 35° C.). The epoxy-based resin is more preferably a two-liquid mixed type epoxy-based resin that is a liquid at an application temperature or less (particularly at room temperature). This is because such resin has excellent spreading characteristics and application characteristics when a resin layer is formed.

Any appropriate compound having an oxetane ring in its molecule is used as the oxetane-based resin. Specific examples of the compound include oxetane compounds represented by the following formulae (1) to (5).

[Chem 9]

The resin composition can further contain any appropriate additive depending on purposes. Examples of the additive include a curing agent, a curing-accelerating agent, a diluent, an antioxidant, a denaturant, a surfactant, a dye, a pigment, a discoloration preventing agent, a UV absorber, a softening agent, a stabilizer, a plasticizer, and an antifoaming agent. The kind, number, and amount of an additive to be contained in a resin composition can be set appropriately depending on purposes.

As the resin composition, a commercially available product may be used as it is, and a commercially available product to which any appropriate additive and/or resin is/are added may be used. Examples of the commercially available epoxy-based resin (resin composition) include Grade 827 and Grade 828 each manufactured by Japan Epoxy Resin Co., Ltd., EP Series and KR Series each manufactured by Adeka Corporation, and Celoxide 2021P and EHPE 3150 each manufactured by Daicel Chemical Industries Limited. Examples of the commercially available oxetane resin include OXT221 manufactured by Toagosei Company, Limited.

The thermoplastic resin is, for example, a thermoplastic resin (A) having repeating units represented by the following general formula (X) and/or the following general formula (Y). The incorporation of such thermoplastic resin can provide resin layers each of which has excellent adhesiveness with the above-mentioned inorganic glass and toughness. As a result, a flexible substrate in which a crack hardly progresses at the time of cutting can be obtained.

[Chem 10]

In the formula (X): $R_1$ represents a substituted or unsubstituted aryl group having 6 to 24 carbon atoms, a cycloalkylene group having 4 to 14 carbon atoms, or a linear or branched alkylene group having 1 to 8 carbon atoms, preferably a substituted or unsubstituted aryl group having 6 to 20 carbon atoms, a cycloalkylene group having 4 to 12 carbon atoms, or a linear or branched alkylene group having 1 to 6 carbon atoms, more preferably a substituted or unsubstituted aryl group having 6 to 18 carbon atoms, a cycloalkylene group having 5 to 10 carbon atoms, or a linear or branched alkylene group having 1 to 4 carbon atoms; and $R_2$ represents a substituted or unsubstituted aryl group having 6 to 24 carbon atoms, a linear or branched alkyl group having 1 to 8 carbon atoms, a linear or branched alkylene group having 1 to 8 carbon atoms, a cycloalkyl group having 5 to 12 carbon atoms, a cycloalkylene group having 5 to 12 carbon atoms, or a hydrogen atom, preferably a substituted or unsubstituted aryl group having 6 to 20 carbon atoms, a linear or branched alkyl group having 1 to 6 carbon atoms, a linear or branched alkylene group having 1 to 4 carbon atoms, a cycloalkyl group having 5 to 10 carbon atoms, a cycloalkylene group having 5 to 10 carbon atoms, or a hydrogen atom. In the formula (Y): $R_3$ and $R_4$ each independently represent a linear or branched alkyl group having 1 to 8 carbon atoms, a hydrogen atom, a linear or branched alkylene group having 1 to 8 carbon atoms, a cycloalkyl group having 5 to 12 carbon atoms, or a cycloalkylene group having 5 to 12 carbon atoms, preferably a linear or branched alkyl group having 1 to 5 carbon atoms, a hydrogen atom, a linear or branched alkylene group having 1 to 5 carbon atoms, a cycloalkyl group having 5 to 10 carbon atoms, or a cycloalkylene group having 5 to 10 carbon atoms, more preferably a linear or branched alkyl group having 1 to 4 carbon atoms, a hydrogen atom, a linear or branched alkylene group having 1 to 4 carbon atoms, a cycloalkyl group having 5 to 8 carbon atoms, or a cycloalkylene group having 5 to 8 carbon atoms; A represents a carbonyl group, or a linear or branched alkylene group having 1 to 8 carbon atoms, preferably a carbonyl group, or a linear or branched alkylene group having 1 to 6 carbon atoms, more preferably a carbonyl group, or a linear or branched alkylene group having 1 to 4 carbon atoms; in represents an integer of 0 to 8, preferably an integer of 0 to 6, more preferably an integer of 0 to 3; and n represents an integer of 0 to 4, preferably an integer of 0 to 2.

The thermoplastic resin (A) has a polymerization degree of preferably 10 to 6000, more preferably 20 to 5000, and particularly preferably 50 to 4000.

Specific examples of the thermoplastic resin (A) include styrene-maleic anhydride copolymers and ester group-containing cycloolefin polymers. Those thermoplastic resins may be used alone or in combination.

The thermoplastic resin (A) has a glass transition temperature of preferably 110° C. or more, more preferably 120° C. or more, and particularly preferably 120 to 350° C. When the glass transition temperature falls within such range, a flexible substrate having excellent heat resistance can be obtained.

Another specific example of the thermoplastic resin is a thermoplastic resin (B) having one or more repeating units each represented by the following general formula (Z). The incorporation of such thermoplastic resin can provide resin layers each of which has excellent adhesiveness with the above-mentioned inorganic glass and toughness. As a result, a flexible substrate in which a crack hardly progresses at the time of cutting can be obtained.

[Chem 11]

(Z)

In the formula (Z): $R^1$ represents a substituted or unsubstituted aryl group having 6 to 24 carbon atoms, a linear or branched alkylene group having 1 to 8 carbon atoms, or a cycloalkylene group having 4 to 14 carbon atoms, or an oxygen atom, preferably a substituted or unsubstituted aryl group having 6 to 20 carbon atoms, a linear or branched alkylene group having 1 to 6 carbon atoms, a cycloalkylene group having 4 to 12 carbon atoms, or an oxygen atom, more preferably a substituted or unsubstituted aryl group having 6 to 18 carbon atoms, a linear or branched alkylene group having 1 to 4 carbon atoms, a cycloalkylene group having 5 to 10 carbon atoms, or an oxygen atom; and $R^2$ represents a substituted or unsubstituted aryl group having 6 to 24 carbon atoms, a linear or branched alkyl group having 1 to 8 carbon atoms, a linear or branched alkylene group having 1 to 8 carbon atoms, a cycloalkyl group having 5 to 12 carbon atoms, a cycloalkylene group having 5 to 12 carbon atoms, or a hydrogen atom, preferably a substituted or unsubstituted aryl group having 6 to 20 carbon atoms, a linear or branched alkyl group having 1 to 6 carbon atoms, a linear or branched alkylene group having 1 to 4 carbon atoms, a cycloalkyl group having 5 to 10 carbon atoms, a cycloalkylene group having 5 to 10 carbon atoms, or a hydrogen atom.

The thermoplastic resin (B) has a polymerization degree of preferably 10 to 6000, more preferably 20 to 5000, and particularly preferably 50 to 4000.

Specific examples of the thermoplastic resin (B) include a polyarylate, a polyester, and a polycarbonate. Those thermoplastic resins may be used alone or in combination.

The thermoplastic resin (B) has a glass transition temperature of preferably 120° C. or more, more preferably 150° C. or more, and particularly preferably 180 to 350° C. When the glass transition temperature falls within such range, a flexible substrate having excellent heat resistance can be obtained.

D. Inorganic Thin Film

The inorganic thin film is formed of any appropriate inorganic compound. The inorganic thin film preferably contains at least one kind of an inorganic compound selected from the group consisting of oxides, nitrides, hydrides, and composite compounds of them. To be specific, the inorganic compound may be a composite compound of an oxide, a nitride and/or a hydride as well as an oxide, nitride, or hydride simple substance. The use of such compound can provide additionally excellent transparency. The inorganic compound for forming the inorganic thin film can have any appropriate structure. To be specific, the compound may have a complete crystal structure, or may have an amorphous structure.

Examples of the element forming the inorganic compound include carbon (C), silicon (Si), aluminum (Al), magnesium (Mg), calcium (Ca), potassium (K), tin (Sn), sodium (Na), boron (B), titanium (Ti), lead (Pb), zirconium (Zr), and yttrium (Y). Those elements may be used alone or in combination. Of those, carbon, silicon, and aluminum are preferably used. Specific examples of the inorganic compound include diamond-like carbon (DLC), $SiN_x$, $SiO_y$, and $AlO_z$. The value for x in $SiN_x$ is preferably 0.3 to 2. The value for y in $SiO_y$ is preferably 1.3 to 2.5. The value for z in $AlO_z$ is preferably 0.7 to 2.3.

Any appropriate configuration can be adopted for the inorganic thin film. To be specific, the inorganic thin film may be formed of a single layer, or may be a laminate of a plurality of layers. A configuration when the inorganic thin film is a laminate is, for example, a three-layer configuration having an inorganic oxide layer, an inorganic nitride layer, and an inorganic oxide layer (such as a laminate of an $SiO_y$ layer, an $SiN_x$ layer, and an $SiO_y$ layer).

E. Smoothing Layer

The smoothing layer is formed of any appropriate forming material. To be specific, the smoothing layer is formed of any appropriate resin composition. The resin composition preferably contains a thermosetting resin or a photocurable resin.

As the thermosetting resin, there is exemplified a resin which can be cured by applying thermal energy, and forma transparent and flat surface after being cured. Representative examples of the thermosetting resin include polycarbonate, polymethylmethacrylate, polyacrylate, a methyl phthalate homopolymer or copolymer, polyethylene terephthalate, polystyrene, diethylene glycol bis(allyl carbonate), an acrylonitrile-styrene copolymer, poly(-4-methylpentene-1), a phenolic resin, an epoxy resin, a cyanate resin, a maleimide resin, and a polyimide resin. Also included are a thermosetting resin obtained by modifying those resins with polyvinyl butyral, acrylonitrile-butadiene rubber, a polyfunctional acrylate compound, or the like, a thermosetting resin obtained by modifying those resins with a thermoplastic resin such as a crosslinked polyethylene resin, a crosslinked polyethylene/epoxy resin, a crosslinked polyethylene/cyanate resin, a polyphenylene ether/epoxy resin, and a polyphenylene ether/cyanate resin, and the like. Those thermosetting resins may be used alone or in combination.

Examples of the photocurable resin include a resin composition composed of an acrylate compound containing a radical-reactive unsaturated compound, a resin composition composed of an acrylate compound and a mercapto compound having a thiol group, and a resin composition obtained by dissolving an oligomer such as epoxy acrylate, urethan acrylate, polyester acrylate, and polyether acrylate in a polyfunctional acrylate monomer. Those resins may be used alone or in combination.

The resin composition for forming the smoothing layer can contain an additive such as an antioxidant, a UV absorber, or a plasticizer as required. In addition, the resin composition can contain an appropriate resin or additive for the purposes of, for example, improving film formability and preventing pinholes.

F. Method of Producing Flexible Substrate

The flexible substrate of the present invention is typically produced by a method including the steps of: applying a resin composition onto the above-mentioned inorganic glass and curing or drying and heat-treating the resin composition to form each of the resin layers; and forming the above-mentioned inorganic thin film on the surface of one of the resultant resin layers. In addition, when a smoothing layer is provided, the method further includes a step of forming the smoothing layer on the surface of the inorganic thin film.

Examples of a method of applying the resin composition in the formation of the resin layers include: coating methods such as air doctor coating, blade coating, knife coating, reverse coating, transfer roll coating, gravure roll coating, kiss coating, cast coating, spray coating, slot orifice coating, calender coating, electrodeposition coating, dip coating, and die coating; and printing methods including relief printings such as flexographic printing, intaglio printings such as direct gravure printing and offset gravure printing, planographic printings such as offset printing, and stencil printings such as screen printing.

In the above-mentioned application, a leveling agent such as silicone oil and an additive such as a curing agent are added to a resin composition, if required, whereby the application suitability of an application liquid and the printing suitability of ink can be enhanced. Further, by subjecting an inorganic glass surface to silane treatment or mixing a silane coupling agent with a resin composition, the adhesiveness between the inorganic glass and the resin composition (finally, resin layers) can be enhanced.

As the silane coupling agent, for example, a vinyl-based, epoxy-based, styryl-based, methacryloxy-based, acryloxy-based, amino-based, ureido-based, chloropropyl-based, mercapto-based, sulfide-based, or isocyanate-based silane coupling agent is used. In the case where the thermoplastic resin (A) and/or (B) is/are used as the resin forming the resin layer, the amino-based, epoxy-based, and isocyanate-based silane coupling agents are preferably used.

A method of curing the resin composition can be selected depending on the kind of the resin in the resin composition. When a thermosetting resin is used, the resin composition is cured by heating. Any appropriate conditions can be adopted as heating conditions. To be specific, a heating temperature is preferably 80 to 250° C., and a heating time is preferably 1 to 30 minutes. When a UV-curable resin is used, the resin composition is cured by UV irradiation. Any appropriate condition can be adopted as an irradiation condition. To be specific, a dose is preferably 100 to 600 mJ/cm$^2$.

Any appropriate drying method (such as natural drying, blast drying, or heat drying) can be adopted for the above-mentioned drying. In the case of, for example, the heat drying, a drying temperature is typically 100 to 200° C., and a drying time is typically 1 to 10 minutes. Any appropriate heat treatment method can be adopted for the heat treatment. A heat treatment temperature is typically 100° C. to 300° C., and a heat treatment time is typically 5 to 45 minutes. When the silane coupling agent is used, it is assumed that the coupling agent and the thermoplastic resin can be chemically bonded to, or caused to interact with, each other by the heat treatment.

Any appropriate method can be adopted as a method of forming the inorganic thin film. Examples of the method include: physical vapor deposition methods such as a vacuum deposition method, an oxidation reaction deposition method, a sputtering method, and an ion plating method; and a plasma chemical vapor deposition method. To be specific, when an inorganic thin film containing a silicon compound is formed, a plasma CVD method involving the use of an organosilicon compound such as $SiH_4$ or tetramethoxysilane (TMOS) as a raw material can be employed. When an inorganic thin film containing DLC is formed, a plasma CVD method involving the use of a hydrocarbon such as methane, acetylene, ethylene, or butadiene as a raw material can be employed.

Any appropriate method can be adopted as a method of forming the smoothing layer. Examples of the method include a spin coating method, a spray method, a blade coating method, a dipping method, and a deposition method. Upon formation of the smoothing layer, a thin film is typically formed by dissolving or dispersing the above-mentioned resin composition in an appropriate diluent such as ethanol, chloroform, tetrahydrofuran, or dioxane.

G. Applications

The flexible substrate of the present invention can be typically used in, for example, a self-luminous display apparatus such as an electroluminescence (EL) display, a plasma display (PD), or a field emission display (FED), or a liquid crystal display apparatus. The flexible substrate of the present invention can be suitably used in an organic electroluminescence (EL) display apparatus of which high gas barrier properties are requested out of those display apparatuses.

Figure 5:
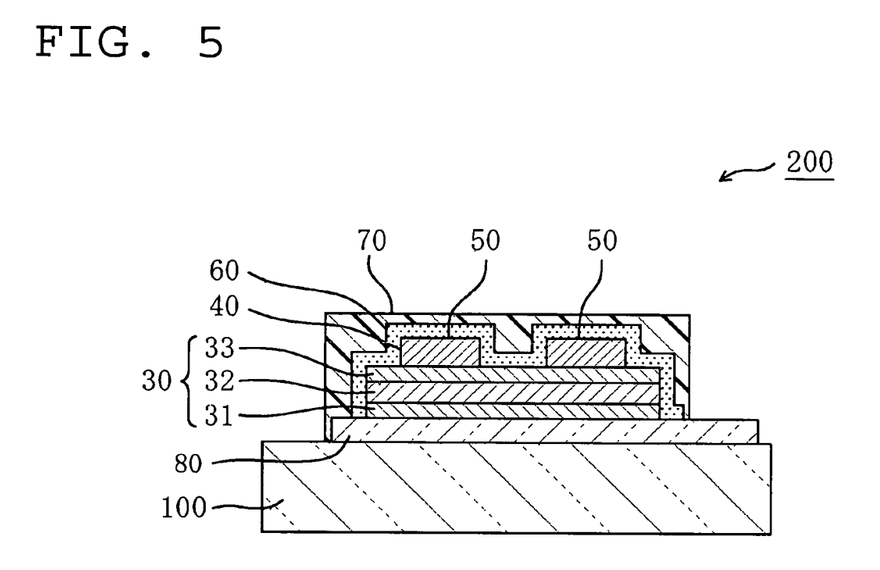
FIG. 5 is a schematic sectional view of an organic EL display apparatus according to one embodiment of the present invention.

FIG. 5 is a schematic sectional view of an organic EL display apparatus according to a preferred embodiment of the present invention. The organic EL display apparatus 200 includes the flexible substrate 100 of the present invention, a transparent electrode 80, an organic light-emitting layer 30, and a counter electrode 40 sequentially formed on the flexible substrate 100, and an inorganic protective film 60 and a resin protective film 70 placed to cover them. The transparent electrode 80 is placed on the side of the inorganic thin film of the flexible substrate 100 where no resin layer is placed (upper side in the illustrated example). The transparent electrode 80, the organic light-emitting layer 30, and the counter electrode 40 in a region where the transparent electrode 80 and the counter electrode 40 overlap each other serve as a pixel 50. Although not illustrated, a hard coat layer may be placed on the side of the flexible substrate 100 where the transparent electrode 80 is not placed. The configuration of the organic EL display apparatus of the present invention is not limited to the illustrated example, and any appropriate configuration can be adopted. For example, the flexible substrate of the present invention may be used as a sealing member by being placed to cover the inorganic protective film 60 and the resin protective film 70. In addition, for example, the organic EL display apparatus may be a top emission system, or may be a bottom emission system.

At least one electrode (typically the anode) of the organic EL display apparatus must be transparent in order that light emitted from the organic light-emitting layer 30 may be extracted. As the forming material for the transparent electrode, there are used indium tin oxide (ITO), indium zinc oxide (IZO), indium tin oxide doped with silicon oxide (ITSO), indium oxide containing tungsten oxide (IWO), indium zinc oxide containing tungsten oxide (IWZO), indium oxide containing titanium oxide (ITiO), indium tin oxide containing titanium oxide (ITTiO), indium tin oxide containing molybdenum (ITMO), and the like. Meanwhile, the use of a substance having a small work function in the cathode plays an important role in facilitating electron injection to improve luminous efficiency. Therefore, the counter electrode 40 is typically formed of a metal film such as an Mg—Ag or Al—Li film and used as the cathode.

The organic light-emitting layer 30 is a laminate of various organic thin films. In the illustrated example, the organic light-emitting layer 30 has: a hole-injecting layer 31 formed of a hole-injectable organic material (such as a triphenylamine derivative) and provided for improving the efficiency with which a hole is injected from the anode; a light-emitting layer 32 formed of a luminous organic substance (such as anthracene); and an electron-injecting layer 33 formed of an electron-injectable material (such as a perylene derivative) and provided for improving the efficiency with which an electron is injected from the cathode. The organic light-emitting layer 30 is not limited to the illustrated example, and any appropriate combination of organic thin films in which light emission can be caused by the recombination of an electron and a hole in the light-emitting layer 32 can be adopted. For example, a configuration formed of a first hole-transporting layer (made of, for example, copper phthalocyanine), a second hole-transporting layer (made of, for example, N,N'-diphenyl-N,N'-dinaphthylbenzidine), and an electron-transporting layer-cum-light-emitting layer (made of, for example, tris(8-hydroxyquinolinato)aluminum) can be adopted.

When a voltage equal to or higher than a threshold is applied between the transparent electrode and the counter electrode, a hole is supplied from the anode to reach the light-emitting layer 32 through the hole-injecting layer 31. Meanwhile, an electron is supplied from the cathode to reach the light-emitting layer 32 through the electron-injecting layer 33. Energy generated by the recombination of the hole and the electron in the light-emitting layer 32 excites the luminous organic substance in the light-emitting layer, and the excited luminous organic substance radiates light upon return to its ground state. Thus, light emission occurs. An image can be displayed by applying a voltage to every desired pixel to cause the organic light-emitting layer to emit light. When color display is performed, for example, the light-emitting layers of three adjacent pixels may be formed of luminous organic substances that emit red (R) light, green (G) light, and blue (B) light, or any appropriate color filter may be provided on each of the light-emitting layers.

In such organic EL display apparatus, the thickness of the organic light-emitting layer 30 is preferably as small as possible. This is because emitted light is preferably transmitted as much as possible. The organic light-emitting layer 30 can be formed of, for example, an extremely thin film having a thickness of about 10 nm. As a result, at the time of non-emission (black state), light incident from the lower surface side of the flexible substrate 100 to transmit through the transparent electrode 80 and the organic light-emitting layer 30 and then reflected at the counter electrode 40 is emitted toward the lower surface side of the flexible substrate 100 again.

The hard coat layer is formed of any appropriate forming material. The layer is typically formed of the same resin composition as that of the above-mentioned smoothing layer.

EXAMPLES

Hereinafter, the present invention is described specifically by way of examples. However, the present invention is not limited to those examples.

Example 1

<Production of Base Material (Resin Layer/Inorganic Glass/Resin Layer)>

A plate-like inorganic glass having a thickness of 50 μm ("D263" manufactured by SCHOTT AG) was washed with methyl ethyl ketone (MEK), and both of its surfaces were subjected to a corona treatment. After that, a silane coupling agent (KBM-403 manufactured by Shin-Etsu Chemical Co., Ltd.) was applied to each of both surfaces of the inorganic glass, and then the resultant was heat-treated at 110° C. for 5 minutes.

Next, a mixed liquid of an epoxy resin 1 represented by the following formula (a) (Celoxide 2021P manufactured by Daicel Chemical Industries Limited.), an epoxy resin 2 (a 1,2-epoxy-4-(2-oxiranyl)cyclohexane adduct of 2,2-bis(hydroxymethyl)-1-butanol, manufactured by Daicel Chemical Industries Limited., EHPE3150), an oxetane resin represented by the following formula (5) (OXT221 manufactured by Toagosei Company, Limited), and a polymerization initiator (SP-170 manufactured by ADEKA CORPORATION) was prepared. The resultant mixed liquid was applied to the front surface of the inorganic glass, and was then irradiated with UV light at 300 mJ/cm$^2$ or more so that the resins were cured. Thus, a resin layer having a thickness of 25 μm was formed. A resin layer having a thickness of 25 μm was similarly formed on the rear surface of the inorganic glass. After that, the resultant was heat-treated at 150° C. for 30 minutes.

Thus, a base material having a thickness of 100 μm was produced.

[Chem 12]

(a)

[Chem 13]

(5)

(Formation of Inorganic Thin Film)

An $SiN_x$ film (having a thickness of 100 nm) was formed on one surface of the base material obtained in the forgoing by a plasma CVD method. Conditions for the formation of the $SiN_x$ film are as described below. Thus, a flexible substrate was produced.

Degree of vacuum: 0.3 Pa ($2.25 \times 10^{-3}$ Torr)
$SiH_4$ gas flow rate: 50 sccm
Nitrogen gas flow rate: 50 sccm
Frequency: 13.56 MHz
Electric power: 700 W Example 2

A flexible substrate was produced in the same manner as in Example 1 except that an $SiO_y$ film (having a thickness of 100 nm) was formed on one surface of the base material by a plasma CVD method. Conditions for the formation of the $SiO_x$ film are as described below.

Degree of vacuum: 0.3 Pa ($2.25 \times 10^{-3}$ Torr)
$SiH_4$ gas flow rate: 10 sccm
Oxygen gas flow rate: 20 sccm
Nitrogen gas flow rate: 50 sccm
Frequency: 13.56 MHz
Electric power: 500 W Example 3

A flexible substrate was produced in the same manner as in Example 1 except that a diamond-like carbon (DLC) film (having a thickness of 100 nm) was formed on one surface of the base material by a plasma CVD method. Conditions for the formation of the DLC film are as described below.

Degree of vacuum: 0.3 Pa ($2.25 \times 10^{-3}$ Torr)
$CH_4$ gas flow rate: 200 sccm
Frequency: 13.56 MHz
Electric power: 1000 W
Electrode DC voltage: 300 V Example 4

A flexible substrate was produced in the same manner as in Example 1 except that an $SiO_y$ film (having a thickness of 100 nm), an $SiN_x$ film (having a thickness of 100 nm), and an $SiO_y$ film (having a thickness of 100 nm) were formed in the stated order on one surface of the base material by a plasma CVD method to form an $SiO_y/SiN_x/SiO_y$ laminate. It should be noted that conditions for the formation of the $SiO_y$ films and the $SiN_x$ film are as described above.

Example 5

A flexible substrate was produced in the same manner as in Example 1 except that the following base material was used.

(Base Material)

A styrene-maleic anhydride copolymer (manufactured by Sigma-Aldrich Corporation and having a weight-average molecular weight of 220,000) was dissolved in methyl isobutyl ketone so that the resultant solution had a concentration of 20 wt %.

Separately, one surface of an inorganic glass measuring 50 μm thick by 10 cm long by 4 cm wide ("D263" manufactured by SCHOTT AG) was washed with methyl ethyl ketone, and was then subjected to a corona treatment. Subsequently, an amine group-containing coupling agent (KBM-603 manufactured by Shin-Etsu Chemical Co., Ltd.) was applied to the surface, and then the resultant was heat-treated at 110° C. for 5 minutes. The above-mentioned styrene-maleic anhydride solution was applied to the surface of the inorganic glass subjected to the coupling treatment, and then the resultant was dried at 160° C. for 10 minutes. After that, the resultant was heat-treated at 200° C. for 30 minutes. The other surface of the inorganic glass was subjected to similar treatments. Thus, a laminate of the inorganic glass, amine group-containing coupling agent layers, and thermoplastic resin layers having a total thickness of 60 μm was obtained.

Further, a 7-wt % solution of a polyamideimide synthesized in Reference Example 1 below in methyl isobutyl ketone was applied to one surface of the laminate, and then the resultant was dried at 160° C. for 10 minutes. After that, the resultant was heat-treated at 200° C. for 30 minutes. The other surface of the inorganic glass was subjected to similar treatments. Thus, a base material having a total thickness of 120 μm was obtained.

(Reference Example 1) Synthesis of Polyamideimide

The polyamideimide was synthesized from 2,2'-bis(3,4-dicarboxyphenyl)hexafluoropropane dianhydride (6FDA), trimellitic anhydride (TMA), and 2,2'-bis(trifluoromethyl)-4,4'-diaminobiphenyl (TFMB). The polyamideimide had a weight-average molecular weight of about 110,000.

Example 6

A flexible substrate was produced by forming an inorganic thin film on the base material used in Example 5 in the same manner as in Example 2.

Example 7

A flexible substrate was produced by forming an inorganic thin film on the base material used in Example 5 in the same manner as in Example 3.

Example 8

A flexible substrate was produced by forming an inorganic thin film on the base material used in Example 5 in the same manner as in Example 4.

Example 9

A flexible substrate was produced in the same manner as in Example 1 except that the following base material was used.

(Base Material)

A 14.5-wt % casting solution was obtained by mixing a 20-wt % solution of a polyarylate (U-Polymer U-100 manufactured by Unitika Limited.) in methylene chloride and cyclopentanone.

Separately, one surface of an inorganic glass having a thickness of 50 μm ("D263" manufactured by SCHOTT AG) was washed with methyl ethyl ketone, and was then subjected to a corona treatment. Subsequently, an amine group-containing coupling agent (KBM-603 manufactured by Shin-Etsu Chemical Co., Ltd.) was applied to the surface, and then the resultant was heat-treated at 110° C. for 5 minutes. The above-mentioned casting solution was applied to the surface of the inorganic glass subjected to the coupling treatment, and then the resultant was dried at 160° C. for 10 minutes. After that, the resultant was heat-treated at 200° C. for 30 minutes. The other surface of the inorganic glass was subjected to similar treatments. Thus, a substrate having a total thickness of 120 μm was obtained.

Example 10

A flexible substrate was produced by forming an inorganic thin film on the base material used in Example 9 in the same manner as in Example 2.

Example 11

A flexible substrate was produced by forming an inorganic thin film on the base material used in Example 9 in the same manner as in Example 3.

Example 12

A flexible substrate was produced by forming an inorganic thin film on the base material used in Example 9 in the same manner as in Example 4.

Example 13

A flexible substrate was produced in the same manner as in Example 1 except that the following base material was used.

(Base Material)

A casting solution was obtained by mixing a polyether sulfone a terminal of which had been modified with a hydroxyl group (Sumika Excel 5003P manufactured by Sumitomo Chemical Company, Limited), cyclopentanone, dimethyl sulfoxide, and a leveling agent (BYK-307 manufactured by BYK-Chemie) at a weight ratio of 140:658:42:0.105.

Separately, one surface of an inorganic glass measuring 50 μm thick by 10 cm long by 4 cm wide ("D263" manufactured by SCHOTT AG) was washed with methyl ethyl ketone, and was then subjected to a corona treatment. Subsequently, an epoxy group end coupling agent (KBM-403 manufactured by Shin-Etsu Chemical Co., Ltd.) was applied to the surface, and then the resultant was heat-treated at 110° C. for 5 minutes. The above-mentioned casting solution was applied to the surface of the inorganic glass subjected to the coupling treatment, and then the resultant was dried at 160° C. for 10 minutes. After that, the resultant was heat-treated at 200° C. for 30 minutes. Thus, a resin layer having a thickness of 35 μm was formed.

The other surface of the inorganic glass was subjected to similar treatments. Thus, a base material having a total thickness of 120 μm was obtained.

Example 14

A flexible substrate was produced by forming an inorganic thin film on the base material used in Example 13 in the same manner as in Example 2.

Example 15

A flexible substrate was produced by forming an inorganic thin film on the base material used in Example 13 in the same manner as in Example 3.

Example 16

A flexible substrate was produced by forming an inorganic thin film on the base material used in Example 13 in the same manner as in Example 4.

Example 17

An organic EL device was produced by the following method, and was then sealed with the flexible substrate of Example 11. Thus, an organic EL display apparatus was obtained.

The surface of the indium tin composite oxide (ITO) layer of a glass substrate having the ITO layer (surface resistance: 10Ω/□) was washed with isopropyl alcohol. After that, the ITO layer was subjected to a UV-ozone treatment for 15 minutes so as to be turned into a transparent electrode (anode). The following organic compound layers were sequentially formed on the anode by employing a vacuum deposition method.

First hole-transporting layer:

Copper phthalocyanine (thickness: 10 nm)

Second hole-transporting layer:

N,N'-diphenyl-N,N'-dinaphthylbenzidine (thickness: 40 nm)

Electron-transporting layer-cum-light-emitting layer:

Tris(8-hydroxyquinolinato)aluminum (thickness: 60 nm)

Next, lithium fluoride and aluminum were sequentially deposited from the vapor so as to have thicknesses of 1 nm and 100 nm, respectively. Thus, a counter electrode (cathode) was formed. The aluminum surface was sealed with the flexible substrate obtained in Example 11 (subjected to an annealing treatment at 110° C. for 15 minutes) through a UV-curable epoxy-based adhesive. Then, UV light was applied from the side of the flexible substrate to cure the adhesive. Thus, the organic EL display apparatus was obtained.

Example 18

An organic EL display apparatus was produced in the same manner as in Example 17 except that sealing was performed with the flexible substrate obtained in Example 15 (subjected to an annealing treatment at 110° C. for 15 minutes).

Comparative Example 1

A laminate was obtained in the same manner as in Example 11 except that the inorganic thin film (DLC film) was not formed.

Comparative Example 2

A laminate was obtained in the same manner as in Example 15 except that the inorganic thin film (DLC film) was not formed.

Comparative Example 3

An organic EL display apparatus was produced in the same manner as in Example 17 except that sealing was performed with the laminate obtained in Comparative Example 1 (subjected to an annealing treatment at 110° C. for 15 minutes).

Comparative Example 4

An organic EL display apparatus was produced in the same manner as in Example 17 except that sealing was performed with the laminate obtained in Comparative Example 2 (subjected to an annealing treatment at 110° C. for 15 minutes).

[Evaluation]
(1) Water Vapor Permeability

Each of the flexible substrates obtained in Examples 1 to 16 was evaluated for its water vapor permeability by an MOCON measurement method in conformity with JIS K 7129B. To be specific, measurement was performed with a water vapor permeability-measuring apparatus "PERMATRAN-W3/33MG (with an HRH-1D type high-precision flow rate controller)" manufactured by MOCON. The measurement was performed under humidity conditions of 40° C. and 90% RH at a gas flow rate of 10.0±0.5 cc/min for a measurement time of 20 hours or more.

In each case, the water vapor permeability was lower than a measurement limit ($10^{-2}$ g/m$^2$·day).

(2) Storage Stability

The organic EL display apparatuses of Examples 17 and 18, and Comparative Examples 3 and 4 were each caused to emit light by applying a DC voltage of 7 V. In each display apparatus, no dark spots were observed, and a uniform emission state was achieved. After that, each display apparatus was stored under a normal-temperature, normal-pressure atmosphere, and its emission state was periodically observed. Table 1 shows emission states after 7 days, after 30 days, and after 60 days. Evaluation criteria are as described below.

o: Uniform emission state
Δ: Generation of dark spots
x: No lighting

TABLE 1

|  | After 7 days | After 30 days | After 60 days |
|---|---|---|---|
| Example 17 | o | o | o |
| Example 18 | o | o | o |
| Comparative Example 3 | o | Δ | x |
| Comparative Example 4 | o | Δ | x |

As is apparent from Table 1, the organic EL display apparatuses using the flexible substrates of the examples of the present invention are markedly excellent in storage stability as compared with the organic EL display apparatuses of the comparative examples. To be specific, each of the organic EL display apparatuses of the examples maintained a uniform emission state even after 60 days while each of the organic EL display apparatuses of the comparative examples showed the generation of dark spots after 30 days and did not light after 60 days. The foregoing shows that the formation of an inorganic thin film on a flexible substrate significantly improves the storage stability.

INDUSTRIAL APPLICABILITY

The flexible substrate of the present invention can be suitably used in an organic electroluminescence (EL) display apparatus.

LIST OF REFERENCE NUMERALS

10 inorganic glass
11, 11' resin layer
12 inorganic thin film
13 smoothing layer
20 base material
100 flexible substrate
200 organic EL display apparatus

The invention claimed is:

1. An organic electroluminescence display apparatus comprising a flexible substrate,
   wherein the flexible substrate comprises:
      a base material including an inorganic glass and resin layers placed on both sides of the inorganic glass;
      an inorganic thin film placed on a side of one of the resin layers where the inorganic glass is not placed, and
   a transparent electrode placed on a side of the inorganic thin film where the resin layers are not placed,
      wherein the inorganic thin film is formed on at least a peripheral edge of one surface of the base material,
      the inorganic thin film is formed from at least one inorganic compound selected from the group consisting of carbon, silicon, aluminum, magnesium, calcium, potassium, sodium, boron, titanium, lead, zirconium and yttrium,
      the inorganic thin film is of a three-layer configuration having an inorganic oxide layer, an inorganic nitride layer, and an inorganic oxide layer,
      the flexible substrate has a surface roughness Ra of 5 nm or less, and
      the flexible substrate has a total thickness of 20 to 200 μm.

2. The organic electroluminescence display apparatus according to claim 1, wherein the inorganic thin film is formed on an entire surface of the one surface of the base material.

3. The organic electroluminescence display apparatus according to claim 1, wherein the flexible substrate further comprises a smoothing layer, the smoothing layer being placed on a side of the inorganic thin film where the resin layers are not placed.

4. The organic electroluminescence display apparatus according to claim 3, wherein the flexible substrate further comprises another inorganic thin film, wherein the another inorganic thin film is placed on a side of the smoothing layer where the resin layers are not placed.

5. The organic electroluminescence display apparatus according to claim 1, wherein the resin layers are each formed of a resin composition containing an epoxy-based resin and/or an oxetane-based resin as a main component.

6. The organic electroluminescence display apparatus according to claim 1, wherein the resin layers each contain a thermoplastic resin having repeating units represented by a general formula (X) and/or a general formula (Y):

(X)

(Y)

where:
- R₁ represents a substituted or unsubstituted aryl group having 6 to 24 carbon atoms, a cycloalkylene group having 4 to 14 carbon atoms, or a linear or branched alkylene group having 1 to 8 carbon atoms;
- R₂ represents a substituted or unsubstituted aryl group having 6 to 24 carbon atoms, a linear or branched alkyl group having 1 to 8 carbon atoms, a linear or branched alkylene group having 1 to 8 carbon atoms, a cycloalkyl group having 5 to 12 carbon atoms, a cycloalkylene group having 5 to 12 carbon atoms, or a hydrogen atom;
- R₃ and R₄ each independently represent a linear or branched alkyl group having 1 to 8 carbon atoms, a hydrogen atom, a linear or branched alkylene group having 1 to 8 carbon atoms, a cycloalkyl group having 5 to 12 carbon atoms, or a cycloalkylene group having 5 to 12 carbon atoms;
- A represents a carbonyl group, or a linear or branched alkylene group having 1 to 8 carbon atoms;
- m represents an integer of 0 to 8; and
- n represents an integer of 0 to 4.

7. The organic electroluminescence display apparatus according to claim 1, wherein the resin layers each contain a thermoplastic resin having one or more repeating units represented by a general formula (Z):

(Z)

where:
- R¹ represents a substituted or unsubstituted aryl group having 6 to 24 carbon atoms, a linear or branched alkylene group having 1 to 8 carbon atoms, or a cycloalkylene group having 4 to 14 carbon atoms, or an oxygen atom; and
- R² represents a substituted or unsubstituted aryl group having 6 to 24 carbon atoms, a linear or branched alkyl group having 1 to 8 carbon atoms, a linear or branched alkylene group having 1 to 8 carbon atoms, a cycloalkyl group having 5 to 12 carbon atoms, a cycloalkylene group having 5 to 12 carbon atoms, or a hydrogen atom.

8. The organic electroluminescence display apparatus according to claim 1, wherein the resin layers each contain a polyether sulfone-based resin.

9. The organic electroluminescence display apparatus according to claim 1, wherein the inorganic compound has an amorphous structure.

10. The organic electroluminescence display apparatus according to claim 1, wherein the transparent electrode is formed of a material selected from the group consisting of indium tin oxide, indium zinc oxide, indium tin oxide doped with silicon oxide, indium oxide containing tungsten oxide, indium zinc oxide containing tungsten oxide, indium oxide containing titanium oxide, indium tin oxide containing titanium oxide, and indium tin oxide containing molybdenum.

11. The organic electroluminescence display apparatus according to claim 1, wherein the inorganic compound is $SiN_x$, where the value for x is 0.3 to 2.

12. The organic electroluminescence display apparatus according to claim 1, wherein the inorganic compound is $SiO_y$, where the value for x is 1.3 to 2.5.

13. The organic electroluminescence display apparatus according to claim 1, wherein the inorganic compound is $AlO_z$ where the value for x is 0.7 to 2.3.

* * * * *

UNITED STATES PATENT AND TRADEMARK OFFICE
CERTIFICATE OF CORRECTION

PATENT NO. : 11,260,627 B2  
APPLICATION NO. : 15/998859  
DATED : March 1, 2022  
INVENTOR(S) : Takeshi Murashige et al.

Page 1 of 1

It is certified that error appears in the above-identified patent and that said Letters Patent is hereby corrected as shown below:

In the Claims

Change Column 25, Line 20:

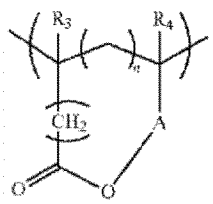

To be:

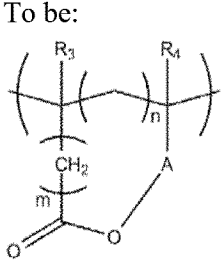

Signed and Sealed this  
Fifth Day of December, 2023

Katherine Kelly Vidal  
*Director of the United States Patent and Trademark Office*